(12) United States Patent
Hamada et al.

(10) Patent No.: US 11,474,423 B2
(45) Date of Patent: Oct. 18, 2022

(54) WAVELENGTH CONVERSION MEMBER, OPTICAL DEVICE, PROJECTOR, AND MANUFACTURING METHOD FOR WAVELENGTH CONVERSION MEMBER

(71) Applicant: Panasonic Intellectual Property Management Co., Ltd., Osaka (JP)

(72) Inventors: Takahiro Hamada, Osaka (JP); Naoyuki Tani, Osaka (JP); Takashi Ohbayashi, Osaka (JP); Yoshihisa Nagasaki, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 17/414,401

(22) PCT Filed: Oct. 4, 2019

(86) PCT No.: PCT/JP2019/039321
§ 371 (c)(1),
(2) Date: Jun. 16, 2021

(87) PCT Pub. No.: WO2020/129357
PCT Pub. Date: Jun. 25, 2020

(65) Prior Publication Data
US 2022/0057702 A1 Feb. 24, 2022

(30) Foreign Application Priority Data

Dec. 18, 2018 (JP) .............................. JP2018-236355

(51) Int. Cl.
*G03B 21/20* (2006.01)
*C09K 11/02* (2006.01)
*C09K 11/77* (2006.01)

(52) U.S. Cl.
CPC .......... *G03B 21/204* (2013.01); *C09K 11/02* (2013.01); *C09K 11/7774* (2013.01)

(58) Field of Classification Search
CPC .................................................... G03B 21/204
See application file for complete search history.

(56) References Cited

U.S. PATENT DOCUMENTS

| 2014/0072812 A1 | 3/2014 | Hamada |
| 2015/0276177 A1 | 10/2015 | Maeda |
| 2020/0011507 A1 | 1/2020 | Nagasaki et al. |

FOREIGN PATENT DOCUMENTS

| JP | 2014-105313 A | 6/2014 |
| JP | 5614675 B2 | 10/2014 |
| JP | 5672622 B2 | 1/2015 |
| JP | 2016-018010 A | 2/2016 |
| JP | 2017-215459 A | 12/2017 |
| JP | 6357835 B2 | 6/2018 |
| WO | 2014/162893 A1 | 10/2014 |
| WO | 2018/159268 A1 | 9/2018 |

OTHER PUBLICATIONS

International Search Report for corresponding Application No. PCT/JP2019/039321, dated Dec. 24, 2019.

*Primary Examiner* — Vip Patel
(74) *Attorney, Agent, or Firm* — Renner, Otto, Boisselle & Sklar, LLP

(57) ABSTRACT

A wavelength conversion device includes a matrix containing inorganic material, a phosphor embedded in the matrix, and filler particles embedded in the matrix and containing resin material. This wavelength conversion device prevents the phosphor from falling.

21 Claims, 12 Drawing Sheets

US 11,474,423 B2

WAVELENGTH CONVERSION MEMBER, OPTICAL DEVICE, PROJECTOR, AND MANUFACTURING METHOD FOR WAVELENGTH CONVERSION MEMBER

This application is a U.S. national stage application of the PCT international application No. PCT/JP2019/039321 filed on Oct. 4, 2019, which claims the benefit of foreign priority of Japanese patent application No. 2018-236355 filed on Dec. 18, 2018, the contents all of which are incorporated herein by reference.

TECHNICAL FIELD

The present disclosure relates to a wavelength conversion device, an optical device, a projector, and a method for manufacturing the wavelength conversion device.

BACKGROUND ART

Optical devices each including an excitation light source and a wavelength conversion device have been developed. The wavelength conversion device includes a phosphor embedded in a matrix. When irradiated with excitation light from the excitation light source, the phosphor emits fluorescence light having a longer wavelength than the excitation light. Attempts have been made to increase brightness of light and optical output of this type of optical device.

PTL 1 discloses a wavelength conversion element contains zinc oxide (ZnO) as material of a matrix. ZnO is inorganic material having a refractive index closer to those of phosphors, and has an excellent light transmitting property and excellent thermal conductivity. The wavelength conversion element described in PTL 1 prevents light from scattering at an interface between a phosphor and the ZnO matrix, providing that high optical output.

CITATION LIST

Patent Literature

PTL 1: Japanese Patent No. 5672622

SUMMARY

A wavelength conversion device includes a matrix containing inorganic material, a phosphor embedded in the matrix, and filler particles embedded in the matrix and containing resin material.

This wavelength conversion device prevents the phosphor from falling.

DESCRIPTION OF EMBODIMENTS

Study Underlying Present Disclosure

A wavelength conversion device may be made by, for example, depositing a phosphor on a substrate and then forming a matrix. When the substrate with the phosphor on the substrate vibrates, the phosphor may fall off from the substrate. In a solution growth method to form an inorganic crystalline matrix, the phosphor may fall off from the substrate when the substrate is immersed in a solution for crystal growth. The phosphor easily falls off from the substrate especially when the phosphor includes large sizes, forms a high pile or is deposited over a large area.

The phosphor may fall off during manufacturing the wavelength conversion element disclosed in PTL 1.

Exemplary embodiments of the present disclosure will be described below with referring to drawings. The following exemplary embodiments are not restrictive of the present disclosure.

Exemplary Embodiment 1

Figure 1:
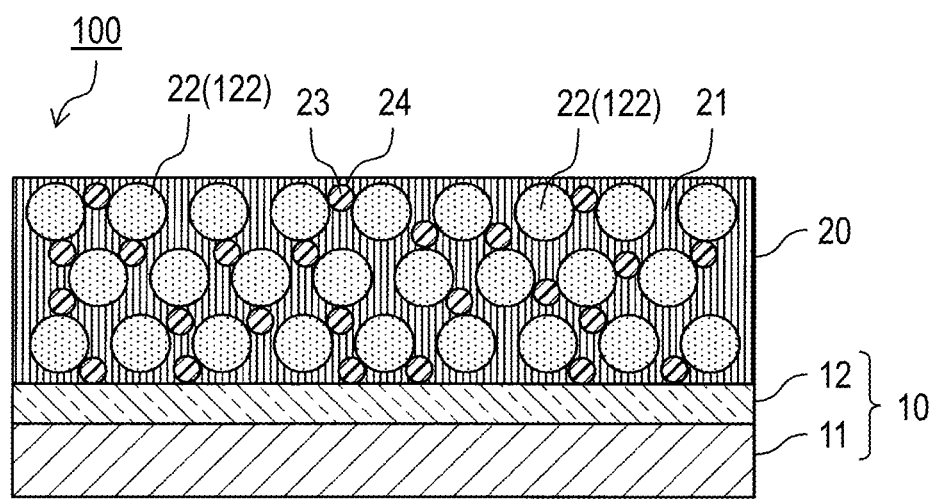
FIG. 1 is a schematic sectional view of a wavelength conversion device according to Exemplary Embodiments of the present disclosure.

FIG. 1 is a schematic sectional view of wavelength conversion device 100 according to Exemplary Embodiment 1. As shown in FIG. 1, wavelength conversion device 100 includes phosphor part 20. Phosphor part 20 includes matrix 21, phosphor 22, and filler particles 23. Phosphor 22 is made of, for example, plural particles 122. Particles 122 of phosphor 22 and filler particles 23 are embedded in matrix 21. Particles 122 of phosphor 22 and filler particles 23 are dispersed in matrix 21. Particles 122 of phosphor 22 and filler particles 23 are surrounded by matrix 21.

Phosphor part 20 has, for example, a layer shape. Phosphor part 20 has a thickness ranging, for example, from 20 μm to 200 μm. The thickness of phosphor part 20 may be larger than 50 μm. Phosphor part 20 with the layer shape has an area ranging, for example, from 0.5 mm$^2$ to 1500 mm$^2$ in a plan view.

Wavelength conversion device 100 may further include substrate 10. Substrate 10 supports phosphor part 20. Phosphor part 20 is disposed on substrate 10.

When irradiated with excitation light having a first wavelength band, wavelength conversion device 100 converts a portion of the excitation light into light having a second wavelength band, and emits the light with the second wavelength band. The light emitted from wavelength conversion device 100 has a longer wavelength than the excitation light. The second wavelength band is different from the first wavelength band. However, the second wavelength band may partially overlap the first wavelength band. The light emitted from wavelength conversion device 100 may include not only light emitted from the phosphor 22, but also the excitation light per se.

Substrate 10 includes, for example, substrate body 11 and film 12. In an example, substrate 10 has a larger thickness than phosphor part 20. Substrate body 11 is made of at least one material selected from the group consisting of stainless steel, composite material containing aluminum and silicon carbide (M-SiC), composite material containing aluminum and silicon (Al—Si), composite material containing aluminum and carbon (AFC), copper (Cu), sapphire ($Al_2O_3$), alumina, gallium nitride (GaN), aluminum nitride (AlN), silicon (Si), aluminum (Al), glass, quartz ($SiO_2$), silicon carbide (SiC), and zinc oxide. Substrate body 11 including copper (Cu) may further include another chemical element, such as tungsten (W) or molybdenum (Mo). Substrate body 11 including at least one selected from the group consisting of the stainless steel, the composite material containing aluminum and silicon carbide (Al—SiC), the composite material containing aluminum and silicon (Al—Si), the composite material containing aluminum and carbon (Al—C), and copper (Cu) has a small thermal expansion coefficient. Substrate body 11 including the at least one selected from the group consisting of stainless steel, the composite material containing aluminum and silicon carbide (Al—SiC), the composite material containing aluminum and silicon (Al—Si), the composite material containing aluminum and carbon (Al—C), and copper (Cu) allows substrate 10 to be suitable for use in a projector. In an example, substrate body 11 has a light transmitting property transmitting the excitation light and the light emitted from phosphor 22. In this case, wavelength conversion device 100 may be preferably used in a transmissive optical device. In the case that substrate 10 having a property transmitting no light, wavelength conversion device 100 may be utilized in a reflective optical device. Substrate body 11 may have a surface polished like a mirror.

A surface of substrate body 11 may be covered with, e.g. an antireflection film, a dichroic mirror, a metal reflection film, a reflection enhancing film, or a protective film. The antireflection film prevents reflection of the excitation light. The dichroic mirror may include plural dielectric layers. The metal reflection film reflects light and is made of metal material, such as silver or aluminum. The reflection enhancing film may include plural dielectric layers. The protective film may physically or chemically protects these films.

Film 12 functions as a base layer for forming phosphor part 20. Matrix 21 of phosphor part 20 is crystalline allows film 12 to function as a seed crystal in a crystal growth process for matrix 21. This means that film 12 is a single-crystal film or a polycrystalline film. Matrix 21 made of single-crystal ZnO or polycrystalline ZnO allows film 12 to be made of a single-crystal ZnO film or a polycrystalline ZnO film. Another chemical element may be added to film 12 in addition to Zn. The chemical element, such as Ga, Al, or B added to film 12 provides film 12 with a small electrical resistance. Film 12 may contain amorphous Zn compound or amorphous ZnO. The thickness of film 12 may range preferably from 5 nm to 2000 nm or more preferably from 5 nm to 200 nm. The thinner film 12 is, the larger the distance between phosphor part 20 and substrate body 11 is, accordingly providing high thermal conductivity. In the case that substrate body 11 functions as a seed crystal, phosphor part 20 may directly contact substrate body 11 without film 12 in between. Substrate body 11 made of, e.g. crystalline GaN or crystalline ZnO allows matrix 21 made of crystalline ZnO to be formed directly on substrate body 11. Even when matrix 21 is not crystalline, phosphor part 20 may directly contact substrate body 11 without film 12 in between.

Particles 122 of phosphor 22 are dispersed in matrix 21 of phosphor part 20. In FIG. 1, particles 122 of phosphor 22 are apart from one another. However, particles 122 of phosphor 22 may contact one another. Filler particles 23 may be disposed between two particles 122 of phosphor 22 and may be disposed between particle 122 of phosphor 22 and substrate 10. For example, filler particles 23 contact particles 122 of phosphor 22. Specifically, filler particles 23 are adhered to particles 122 of phosphor 22. In the present disclosure, the term "adhere" refers to a state of two things attached to each other. The term "adhesion" used in the present disclosure encompasses "cohesion", "close adhesion", and "attachment", among others. Wavelength conversion device 100 satisfies, for example, at least one selected from the group consisting of conditions: (i) that one filler particle 23 adheres to both two particles 122 of phosphor 22, (ii) one filler particle 23 adheres to particle 122 of phosphor 22 and substrate 10, and (iii) that one filler particle 23 adheres to particle 122 of phosphor 22 and matrix 21. Filler particles 23 may be apart from one another. Filler particles 23 may contact one another. Some of filler particles 23 may form a lump by adhering one another. A surface of particle 122 of phosphor 22 may be partly covered by filler particles 23 adhering to particle 122 of phosphor 22. Particles 122 of phosphor 22 and filler particles 23 may be piled up like a stone wall.

The material of phosphor 22 is not particularly limiting. Various luminescent substances may be used as the material phosphor 22. Specifically, luminescent substance, such as $Y_3Al_5O_{12}$:Ce (YAG), $Y_3(Al,Ga)_5O_{12}$:Ce (GYAG), $Lu_3Al_5O_{12}$:Ce (LuAG), $(Si,Al)_6(O,N)_8$:Eu (β-SiAlON), $(La,Y)_3Si_6N_{11}$:Ce (LYSN), or $Lu_2CaMg_2Si_3O_{12}$:Ce (LCMS) may be used. Phosphor 22 may further contain another material in addition to the luminescent substance. Material having a light transmitting property may be the another material. The material having the light transmitting property is glass, $SiO_2$, and $Al_2O_3$. Phosphor 22 may contain plural kinds of phosphor with different compositions. The material of phosphor 22 may be selected based on chromaticity of light emitted from wavelength conversion device 100.

Particles 122 of phosphor 22 have an average particle diameter ranging, e.g. from 0.1 μm to 50 μm. The average particle diameter of particles 122 of phosphor 22 may be larger than 10 μm. The average particle diameter of particles 122 of phosphor 22 may be ascertained, for example, by a method below. A section of wavelength conversion device 100 is observed first with a scanning electron microscope. Image processing is used to calculate an area of specified particle 122 of phosphor 22 appearing in an obtained electron microscope image. A diameter of a circle having an area identical to the calculated area is determined as a particle size (diameter) of specified particle 122 of phosphor 22. Particle sizes of any number of phosphor particles 122 (e.g., fifty phosphor particles 122) are calculated, and an average of those calculated values is considered as the average particle diameter of particles 122 of phosphor 22. In the present disclosure, the shapes of particles 122 of phosphor 22 are not limited. Particles 122 of phosphor 22 may have spherical, ellipsoidal, scaly or fibrous shapes. In the present disclosure, the above method for measuring the average particle diameter is not limited.

Filler particles 23 are dispersed in matrix 21 of phosphor part 20. Filler particles 23 contain resin material. The resin material may be contained as a primary ingredient of filler particles 23. The term "primary ingredient" refers to an ingredient that is most abundant in terms of its weight ratio in filler particles 23. For example, filler particles 23 are substantially made of the resin material. The term "substantially made of" refers to exclusion of any other ingredient that modifies an essential feature of the material mentioned. However, filler particles 23 may further contain impurity in addition to the resin material. The resin material may contain thermoplastic resin. The resin material may contain thermosetting resin. The thermoplastic resin includes, for example, at least one selected from the group consisting of polystyrene (PS), methacrylate resin, and polycarbonate (PC). The methacrylate resin includes, for example, polymethyl methacrylate (PMMA). Filler particles 23 containing the thermoplastic resin increases a strength of wavelength conversion device 100. The thermoplastic resin may include thermoplastic elastomer. The thermoplastic elastomer may be styrene elastomer, olefin elastomer, vinyl chloride elastomer, urethane elastomer, ester elastomer, or amide elastomer. The term "elastomer" refers to material having rubber elasticity.

The thermosetting resin includes, for example, at least one selected from the group consisting of silicone resin and epoxy resin. The silicone resin is, for example, polymer compound including siloxane bonds. The silicone resin has, for example, the siloxane bonds as a main backbone. The silicone resin may include dimethylpolysiloxane and polyorganosilsesquioxane. The polyorganosilsesquioxane has, for example, a three-dimensional network structure having the siloxane bonds as cross links. This structure is expressed, for example, by the general formula $(RSiO_{3/2})_n$. In this general formula, R is, for example, an alkyl group.

The thermosetting resin may include thermosetting elastomer. The thermosetting elastomer may include urethane rubber, silicone rubber, and fluororubber. The silicone rubber is silicone resin having rubber elasticity. The silicone rubber has, for example, a cross-linked dimethylpolysiloxane structure.

Commercially-available filler particles including silicone resin or silicone rubber are, e.g. the KMP series, the KSP series, and the X-52 series from Shin-Etsu Chemical Co., Ltd., and the EP series, the TREFIL series, and 30-424 from Additive Dow Corning Toray Co., Ltd. The resin material containing the polymer compound including the siloxane bonds provides filler particles 23 with excellent heat resistance.

Filler particle 23 may have surface 24 modified with functional group, thereby having excellent dispersibility. Surface 24 modified with the functional group suppresses or prevents agglomeration of filler particles 23. The functional group modifying surface 24 may include epoxy group, (meth)acryloyl group, and methyl group.

An average particle diameter of filler particles 23 may range from 0.1 μm to 20 μm or from 1.0 μm to 10 μm. In an example, the average particle diameter of filler particles 23 is smaller than the average particle diameter of particles 122 of phosphor 22. Ratio (D2/D1) of average particle diameter D2 of filler particles 23 to average particle diameter D1 of particles 122 of phosphor 22 ranges, for example, from 0.01 to 0.90. The average particle diameter of filler particles 23 may be measured by the same method as for the average particle diameter of particles 122 of phosphor 22. Total volume V1 of particles 122 of phosphor 22 and total volume V2 of filler particles 23 may provide a value of V2/(V1+V2) ranging from 0.01 to 0.70 or from 0.05 to 0.16. Filler particles 23 have a specific gravity ranging, for example, from 0.5 g/cm$^3$ to 1.5 g/cm$^3$. Total volume V1 of particles 122 of phosphor 22 is the volume of whole phosphor 22.

Figure 2:
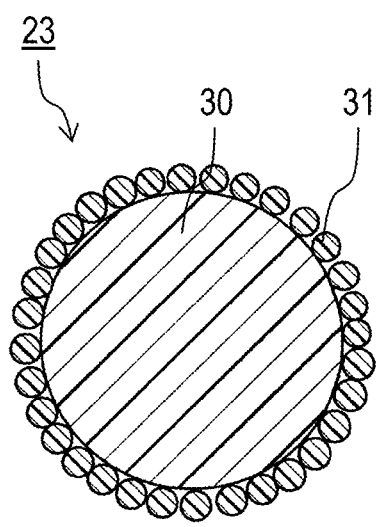
FIG. 2 is a sectional view of a filler particle of the wavelength conversion device illustrated in FIG. 1.

In the present disclosure, the shape of filler particle 23 is not particularly limited. Filler particle 23 may have a spherical, ellipsoidal, scaly or fibrous shape. FIG. 2 illustrates a section of filler particle 23. As illustrated in FIG. 2, filler particle 23 may include core 30 and shell 31 covering core 30. A surface of core 30 may be entirely or partly covered with shell 31. In an example, shell 31 contacts core 30. In an example, a composition of core 30 is different from a composition of shell 31. For example, core 30 is made of silicone rubber while shell 31 is made of silicone resin other than silicone rubber. Core 30 may have a spherical shape. In FIG. 2, shell 31 is composed of plural particles. Shell 31 may have a layer shape. The particles constituting shell 31 have an average particle diameter ranging, for example, from 1 nm to 1 μm. Shells 31 provide filler particles 23 with excellent dispersibility. Shells 31 suppresses or prevents agglomeration of filler particles 23.

The resin material containing the thermoplastic elastomer or the thermosetting elastomer provides filler particles 23 with rubber elasticity. Filler particles 23 may have a rubber hardness ranging from 10 to 90 or from 30 to 75. The rubber hardness of filler particles 23 can be measured, for example, by a method below conforming to Japanese Industrial Standard (JIS) K6253-3:2012. A test piece having the same composition as filler particle 23 is prepared first. The test piece has a shape as specified in JIS K6253-3:2012. A rubber hardness of the test piece is measured, for example, by a method with a type A durometer as specified in JIS K6253-3:2012. The obtained rubber hardness of the test piece can be considered as the rubber hardness of filler particles 23. In the present disclosure, the above method for measuring the rubber hardness, however, is not limited to above.

Filler particles 23 have glass transition temperature Tg that is not particularly limited. The thermoplastic resin allows filler particles 23 to have glass transition temperature Tg ranging, for example, from 50° C. to 300° C. Filler particles 23 containing the thermosetting elastomer have glass transition temperature Tg lower than or equal to 30° C. or lower than or equal to 0° C. Silicone rubber has glass transition temperature Tg of −125° C. A lower limit for glass transition temperature Tg of filler particles 23 is, for example, −273° C. Glass transition temperature Tg of filler particles 23 lower than a room temperature provides filler particles 23 with excellent adhesiveness at the room temperature. In the present disclosure, the room temperature ranges from 25° C. to 30° C. Glass transition temperature Tg of filler particles 23 can be measured, for example, by a method conforming to JIS K7121:1987 with a differential scanning calorimeter (DSC). When ascertaining definite glass transition temperature Tg of filler particles 23 that include, for example, silicone rubber and may have glass transition temperature Tg lower than or equal to 0° C., a DSC capable of measuring glass transition temperature Tg even at a temperature lower than or equal to 0° C. is used. In the present disclosure, the above method for measuring glass transition temperature Tg, however, is not limited to above.

When irradiated with the excitation light, filler particles 23 emit no fluorescence light or only fluorescence light with negligible intensity. A light absorptivity of filler particles 23 is not particularly limited. For light with a wavelength of 550 nm, the absorptivity of filler particles 23 is preferably less than or equal to 25%, more preferably less than or equal to 10%, or even more preferably less than or equal to 1%. Filler particles 23 may substantially absorb no light with the wavelength of 550 nm. For light with a wavelength of 450 nm, the absorptivity of filler particles 23 is preferably less than or equal to 25%, more preferably less than or equal to 10%, or even more preferably less than or equal to 1%. Filler particles 23 may substantially absorb no light with the wavelength of 450 nm.

The light absorptivity of filler particles 23 can be measured, for example, with a commercially available absolute PL quantum yield measurement device. The absolute PL quantum yield measurement device utilizes a photoluminescence (PL) method for measuring an absolute value of a luminescence quantum yield of a sample made of, e.g. as a luminescence material to be used for a light-emitting diode (LED). A luminescence quantum yield of powder sample can be measured by a method below that uses a measurement sample holder and a petri dish for power measurement. The sample is placed in the petri dish first. Next, this petri dish is placed inside an integrating sphere. The sample is irradiated with separated excitation light with a particular wavelength that originates from a xenon light source. Light emitted from the sample is measured. Thus the luminescence quantum yield of the sample can be measured. The light absorptivity of filler particles 23 can be measured, for example, by a method below. An empty petri dish containing no sample is placed inside the integrating sphere first. Luminescence quantum yield measurement is performed with the petri dish being empty. This enables a photon count of excitation light to be measured in the absence of the sample. Next, filler particles 23 are placed as a sample in the petri dish, and this petri dish is placed inside the integrating sphere. A luminescence quantum yield of filler particles 23 is measured. This enables a photon count of the excitation light to be measured in the presence of filler particles 23. From these measurement results, a ratio of a photon count absorbed by filler particles 23 to the photon count of the excitation light with which filler particles 23 have been irradiated may be calculated. This ratio may be considered as the light absorptivity of filler particles 23. The petri dish is made of, for example, synthetic quartz that absorbs less light in a measurement wavelength range. The bottom of the petri dish has, for example, a circular shape in plan view. In plan view, the bottom of the petri dish has a diameter of, for example, about 17 mm. The petri dish has a thickness of, for example, about 5 mm. The petri dish may have a lid.

For light with a wavelength of 550 nm, an absorptivity of filler particles 23 that have been heated at an ambient temperature of 200° C. for 24 hours is preferably less than or equal to 25%, more preferably less than or equal to 10%, or even more preferably less than or equal to 1%. For the light with the wavelength of 550 nm, an absorptivity of filler particles 23 that have been heated at an ambient temperature of 240° C. for 24 hours is preferably less than or equal to 25%, more preferably less than or equal to 10%, or even more preferably less than or equal to 1%.

Matrix 21 contains inorganic material. The inorganic material may include inorganic crystal. The inorganic material includes, for example, at least one selected from the group consisting of ZnO, $SiO_2$, $Al_2O_3$, $SnO_2$, $TiO_2$, PbO, $B_2O_3$, $P_2O_5$, $TeO_2$, $V_2O_5$, $Bi_2O_3$, $Ag_2O$, $Tl_2O$, and BaO. Matrix 21 may contain glass as inorganic material.

Matrix 21 contains, for example, zinc oxide (ZnO). ZnO is suitable to material of matrix 21 in view of transparency and thermal conductivity.

ZnO has high thermal conductivity. Therefore, ZnO as the material of matrix 21 enables heat to be easily let out of phosphor part 20 (mainly toward substrate 10), accordingly reducing or maintaining temperature of phosphor 22. ZnO may be contained as a primary ingredient of matrix 21. For example, matrix 21 is substantially made of ZnO. Matrix 21 may further contain impurity in addition to ZnO.

ZnO serving as the material of matrix 21 is single-crystal ZnO or polycrystalline ZnO. ZnO has a wurtzite crystal structure. When formed by crystal growth, matrix 21 has, for example, a crystal structure corresponding with a crystal structure of film 12. This means that when c-axis oriented polycrystalline ZnO is used as film 12, matrix 21 has c-axis oriented polycrystalline ZnO. The term "c-axis oriented ZnO" means that a plane parallel to a main surface of substrate 10 is a c-plane. The term "main surface" of substrate 10 refers to a surface with the largest area. Matrix 21 containing c-axis oriented polycrystalline ZnO provides phosphor part 20 with small or no internal light scattering, providing high optical output.

Polycrystalline ZnO oriented in c-axis contains plural columnar crystal grains oriented in a c-axis. This oriented polycrystalline ZnO oriented in c-axis has fewer grain boundaries extending in a c-axis. The term "columnar crystal grains oriented in a c-axis oriented" refers to tall ZnO crystal grains formed on substrate 10 as a result of faster ZnO growth along a c-axis than ZnO growth along an a-axis. The c-axis of each ZnO crystal grain is parallel to a direction normal to substrate 10. In other words, the c-axis of the ZnO crystal grain is parallel to the direction normal to a surface of phosphor part 20 configured to receive excitation light. Whether or not ZnO is c-axis oriented crystalline can be ascertained by X-ray diffraction (XRD) measurement (2θ/ω scan). ZnO is determined to be c-axis oriented crystalline ZnO when diffraction peaks for ZnO obtained from an XRD measurement result show that diffraction peak intensity resulting from the c-plane of ZnO is greater than diffraction peak intensities resulting from other planes of ZnO than the c-plane. International Publication No. WO2013/172025 discloses in detail a matrix made of polycrystalline ZnO oriented in a c-axis.

A light emission efficiency of wavelength conversion device 100 is preferably more than or equal to 85% or more preferably more than or equal to 90%. In the present disclosure, the light emission efficiency of wavelength conversion device 100 refers to a ratio of a photon count of fluorescence light emitted from wavelength conversion device 100 to an excitation light photon count absorbed by wavelength conversion device 100 when wavelength conversion device 100 is irradiated with excitation light. The light emission efficiency of wavelength conversion device 100 can be measured, for example, with a multichannel spectroscope. The light emission efficiency of wavelength conversion device 100 is a value obtained when wavelength conversion device 100 is irradiated with excitation light having an energy density of 2 W/mm$^2$, for example.

Alight emission efficiency of wavelength conversion device 100 that has been heated at an ambient temperature of 240° C. for 24 hours is preferably more than or equal to 85% or more preferably more than or equal to 90%.

A method for manufacturing wavelength conversion device 100 will be described below.

Figure 3A:
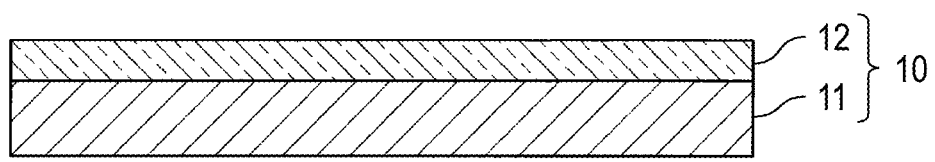
FIG. 3A is a sectional view of a substrate used in a method for manufacturing the wavelength conversion device according to Embodiment 1.

A method for manufacturing substrate 10 will be described first. FIG. 3A is a sectional view of substrate 10 that is used in the method for manufacturing wavelength conversion device 100. A crystalline ZnO film, for example, constituting film 12 is formed on substrate body 11. Vapor phase deposition is used as a method for forming the ZnO film, and examples of the vapor phase deposition include vapor deposition, electron-beam vapor deposition, reactive plasma deposition, ion assisted deposition, sputtering, and pulsed laser deposition. Film 12 may be formed by a method below. A sol containing precursor, such as a zinc alkoxide, is prepared first. The sol is applied to substrate body 11 by printing to form a coating film. Next, the coating film is heat treated, thereby providing film 12. Film 12 may be single-crystal ZnO film or polycrystalline ZnO film.

Figure 3B:
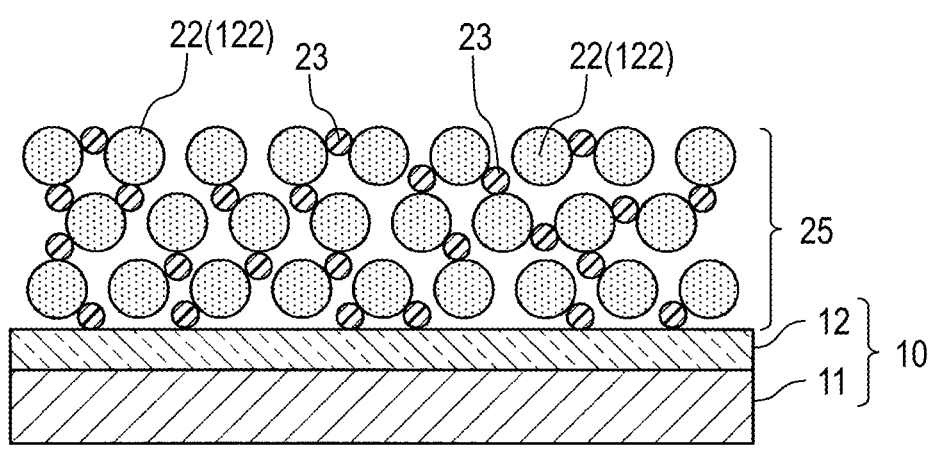
FIG. 3B illustrates the substrate shown in FIG. 3A having a precursor of a phosphor part formed thereon.

A method for making precursor 25 of phosphor part 20 on substrate 10 (film 12) will be described below. FIG. 3B illustrates precursor 25 of phosphor part 20 formed on the substrate shown in FIG. 3A. Particles 122 of phosphor 22 and filler particles 23 are deposited on substrate 10. For example, a dispersion solution containing particles 122 of phosphor 22 and filler particles 23 is prepared. Substrate 10 is disposed in the dispersion solution, and an electrophoresis method is used to deposit particles 122 of phosphor 22 and filler particles 23 onto substrate 10. Particles 122 of phosphor 22 and filler particles 23 are thus deposited on substrate 10. Alternatively, particles 122 of phosphor 22 and filler particles 23 are disposed in the dispersion solution with substrate 10 to deposit particles 122 of phosphor 22 and filler particles 23 on substrate 10. Alternatively, a thick-film formation method, such as printing, utilizing coating liquid containing particles 122 of phosphor 22 and filler particles 23 to deposit particles 122 of phosphor 22 and filler particles 23 on substrate 10.

Next, particles 122 of phosphor 22 are fixed to substrate 10 with filler particles 23. For example, filler particles 23 is heated to soften the resin contained in filler particles 23. This configuration allows filler particles 23 to adhere to substrate 10 and particles 122 of phosphor 22, thus fixing particles 122 of phosphor 22 to substrate 10. Filler particles 23 having rubber elasticity increase areas of contacts between filler particle 23 and the particles of phosphor 22. Filler particles 23 are configured to firmly fixing particles 122 of phosphor 22. Without adhering directly to substrate 10, filler particles 23 may adhere to phosphor particles 122 fixed to substrate 10 and other phosphor particles 122. Filler particles 23 having adhesiveness at a room temperature may omit the heating of filler particles 23. Precursor 25 is thus obtained with filler particles 23 fixing particles 122 of phosphor 22 to substrate 10. Precursor 25 includes filler particles 23 and particles 122 of phosphor 22, thus having a porous structure. A surface of film 12 facing precursor 25 has both a region covered with filler particles 23 and a region not covered with filler particles 23.

Conditions of the heating of filler particles 23 are not particularly limited. An ambient temperature at which filler particles 23 are heated may range from 50° C. to 400° C. or from 100° C. to 300° C. Filler particles 23 may be heated for a duration ranging from 5 minutes to 5 hours.

Next, matrix 21 is formed such that filler particles 23 and particles 122 of phosphor 22 are embedded in matrix 21, thereby providing phosphor part 20. Matrix 21 containing glass allows phosphor part 20 to be made by the following method. Sol containing silicon alkoxide is prepared first. The sol is applied onto precursor 25, thereby providing precursor 25 with the porous structure filled with the sol. The sol is gelled and baked, thereby providing phosphor part 20. Matrix 21 containing inorganic material other than glass allows phosphor part 20 to be formed with sol containing an alkoxide similarly to above. Phosphor part 20 may be made of precursor 25 internally filled with glass with glass containing inorganic material and having a low-melting temperature.

In the case that matrix 21 contains zinc oxide, a solution growth method using solution containing Zn ions is a usable method for forming matrix 21. Examples of the solution growth method include chemical bath deposition that is performed under atmospheric pressure, hydrothermal synthesis that is performed under a pressure higher than or equal to the atmospheric pressure, and electrochemical deposition that involves voltage or current application. The solution to be used for crystal growth is, for example, aqueous zinc nitrate ($Zn(NO_3)_2$) solution containing hexamethylenetetramine ($C_6H_{12}N_4$). The aqueous zinc nitrate solution has a pH ranging, for example, from 5 to 7. The solution growth method provides the crystal growth of matrix 21 on film 12. The crystal growth of matrix 21 also takes place in the precursor 25 having the porous structure. Phosphor part 20 is thus obtained. Japanese Patent Laid-Open Publication No. 2004-315342 discloses a solution growth method in detail.

In the manufacturing method according to the embodiment, substrate 10 may be removed from wavelength conversion device 100 after matrix 21 is formed. Substrate body 11 and film 12 may be detached, for example, by heating substrate body 11. This operation removes substrate 10 from wavelength conversion device 100. Substrate body 11 may be detached from wavelength conversion device 100 by focusing a laser beam to an interface between substrate body 11 and film 12.

In precursor 25, filler particles 23 fix particles 122 of phosphor 22 to substrate 10. This configuration prevents particles 122 of phosphor 22 from falling off from substrate 10 before matrix 21 is formed. This means that wavelength conversion device 100 according to the embodiment prevents falling of particles 122 of phosphor 22, accordingly increasing a yield rate of wavelength conversion devices 100. Particles 122 of phosphor 22 prevented from falling allows phosphor part 20 of wavelength conversion device 100 to include practically enough particles 122 of phosphor 22.

Exemplary Embodiment 2

Figure 4:
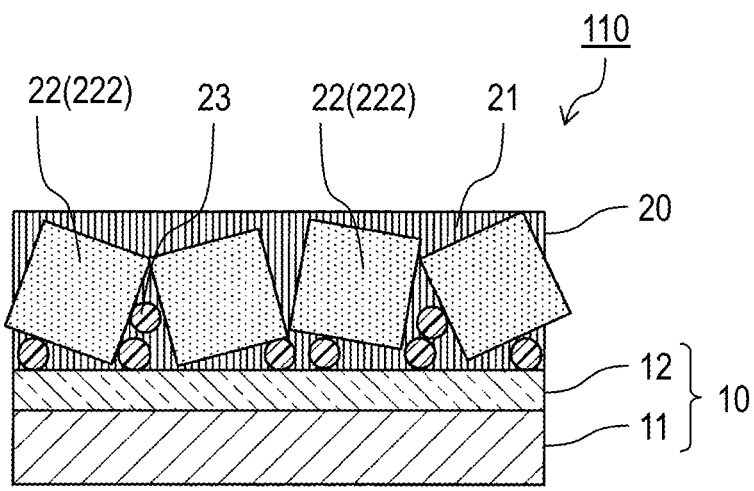
FIG. 4 is a schematic sectional view of a wavelength conversion device according to Exemplary Embodiment 2 of the present disclosure.

FIG. 4 is a schematic sectional view of wavelength conversion device 110 according to Exemplary Embodiment 2. As illustrated in FIG. 4, phosphor 22 of wavelength conversion device 110 is made of blocks 222. Phosphor part 20 includes phosphor 22 and has portions of phosphor 22 partially exposed. Wavelength conversion device 110 has a structure similar to that of wavelength conversion device 100 according to Embodiment 1. Therefore, those elements common to wavelength conversion device 100 according to Embodiment 1 and wavelength conversion device 110 according to the present embodiment are denoted by the same reference numerals and will not be described. In other words, descriptions of the following exemplary embodiments can be applied to one another as long as there is no technical inconsistency. As long as there is no technical inconsistency, the exemplary embodiments may be combined.

Each block 222 of phosphor 22 has, for example, a polyhedron shape. Phosphor 22 may have rectangular-parallelepiped shapes or cubic shapes. Phosphor 22 may have a lumpy shape. Blocks 222 of phosphor 22 may be formed by, for example, crushing a phosphor with a plate shape. Block 222 of phosphor 22 may have a larger size than phosphor particle 122.

The portions of phosphor 22 are partially exposed to surfaces of phosphor part 20 of wavelength conversion device 110. Phosphor 22 may be exposed to an upper surface of phosphor part 20. In other words, phosphor 22 may be partly embedded in matrix 21 and thus is not necessarily entirely embedded.

Exemplary Embodiment 3

Figure 5:
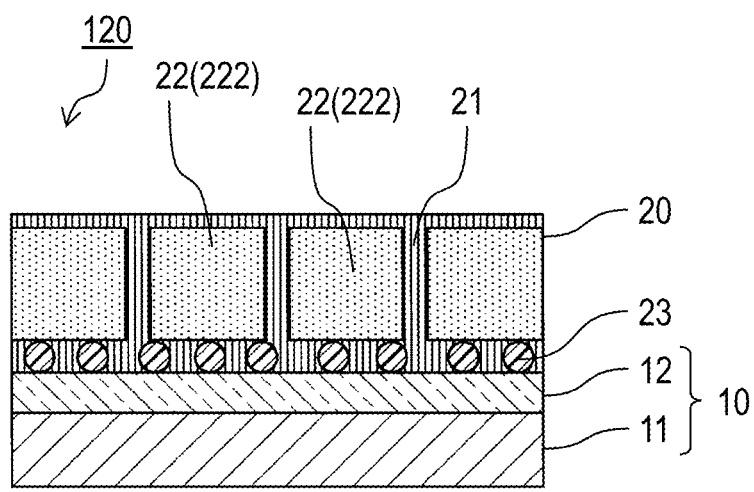
FIG. 5 is a schematic sectional view of a wavelength conversion device according to Exemplary Embodiment 3 of the present disclosure.

Phosphors 22 of wavelength conversion device 110 according to Embodiment 2 may be arranged regularly. FIG. 5 is a schematic sectional view of wavelength conversion device 120 according to Exemplary Embodiment 3. As illustrated in FIG. 5, phosphors 22 of wavelength conversion device 120 are arranged with equal spaces in a direction perpendicular to a thickness of phosphor part 20. Upper surfaces and lower surfaces of phosphors 22 may extend along the direction perpendicular to the thickness of phosphor part 20. The upper surfaces of phosphors 22 may be parallel to the lower surfaces of phosphors 22. Sides of phosphor 22 may extend along the thickness of phosphor part 20. The sides of phosphor 22 may be parallel to one another.

Filler particles 23 adhere for example, to the lower surfaces of phosphors 22 and substrate 10. Filler particles 23 may adhere to a side of one phosphor 22 and a side of another phosphor 22.

Phosphor part 20 of wavelength conversion device 120 may have portions of phosphor 22 exposed. Phosphor 22 may be exposed to an upper surface of phosphor part 20. In other words, phosphor 22 may be partly embedded in matrix 21, and thus is not necessarily embedded entirely.

Exemplary Embodiment 4

Figure 6:
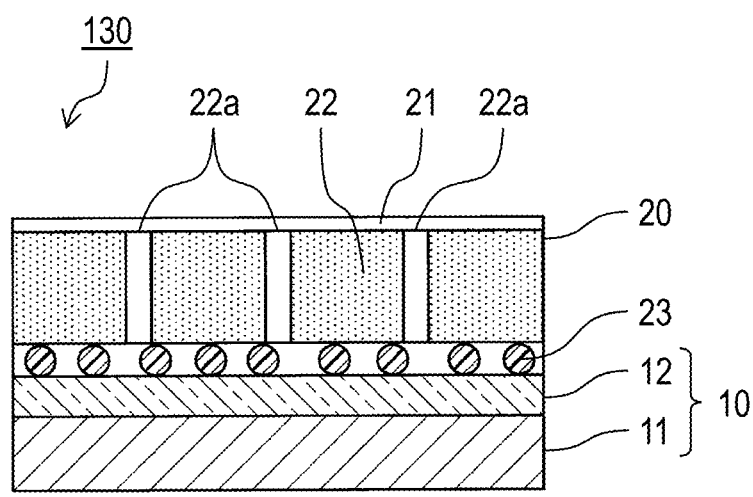
FIG. 6 is a schematic sectional view of a wavelength conversion device according to Exemplary Embodiment 4 of the present disclosure.

FIG. 6 is a schematic sectional view of wavelength conversion device 130 according to Exemplary Embodiment 4. As illustrated in FIG. 6, phosphor 22 is included as a single solid in phosphor part 20 of wavelength conversion device 130. Phosphor 22 has, for example, a plate shape.

Phosphor 22 with the plate shape may have a larger size than phosphor particle 122. Wavelength conversion device 130 is otherwise similar in structure to wavelength conversion device 100 according to Embodiment 1. Phosphor 22 may have plural holes 22a therein. Holes 22a are, for example, through-holes passing through phosphor 22 along a thickness of phosphor 22. In an example, matrix 21 fills holes 22a. In FIG. 6, matrix 21 is not hatched for explanation thereof.

Holes 22a may be formed by, for example, radiating a laser beam or an ion beam to phosphor 2 having the plate shape. Holes 22a may formed by, for example, etching phosphor 22 with the plate shape.

Filler particles 23 adhere to, for example, substrate 10 and a lower surface of phosphor 22. Phosphor 22 included in phosphor part 20 may be made of plural plates. The plates of phosphor 22 may be arranged along a thickness of phosphor part 20 in phosphor part 20. Filler particles 23 here may adhere to one of upper surfaces of phosphor 22 and to opposite lower surfaces of phosphor 22.

Phosphor part 20 of wavelength conversion device 130 may have an upper surface of plate-shaped phosphor 22 exposed. Phosphor part 20 may have sides of plate-shaped phosphor 22 exposed. In other words, plate-shaped phosphor 22 may be partly embedded in matrix 21 and thus is not necessarily embedded entirely.

Exemplary Embodiment 5

Figure 7:
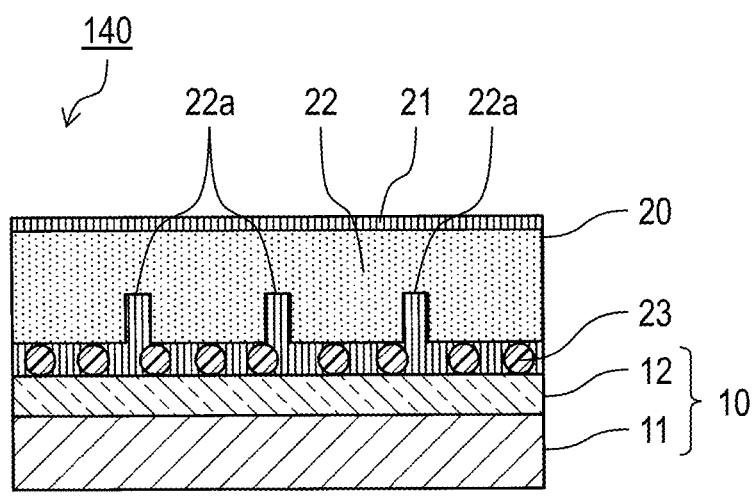
FIG. 7 is a schematic sectional view of a wavelength conversion device according to Exemplary Embodiment 5 of the present disclosure.

Holes 22a of wavelength conversion device 130 according to Embodiment 4 are not necessarily the through-holes. FIG. 7 is a schematic sectional view of wavelength conversion device 140 according to Exemplary Embodiment 5. As shown in FIG. 7, holes 22a of wavelength conversion device 140 open only to a lower surface of phosphor 22 and not to an upper surface of phosphor 22. Holes 22a may open only to the upper surface of phosphor 22 and not open to the lower surface of phosphor 22.

Phosphor part 20 of wavelength conversion device 140 may have the upper surface of plate-shaped phosphor 22 exposed. Phosphor part 20 may have sides of plate-shaped phosphor 22 exposed. In other words, plate-shaped phosphor 22 may be partly embedded in matrix 21 and thus is not necessarily embedded entirely.

Optical Device According to Exemplary Embodiment

Figure 8:
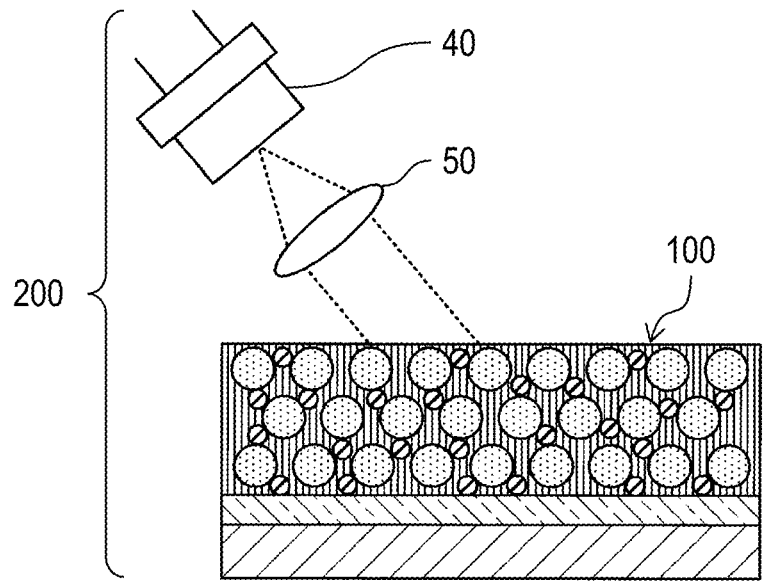
FIG. 8 is a schematic sectional view of a reflective optical device including the wavelength conversion device according to the present disclosure.

FIG. 8 is a schematic sectional view of optical device 200 according to an exemplary embodiment. As shown in FIG. 8, optical device 200 includes wavelength conversion device 100 and excitation light source 40. Excitation light source 40 is configured to emit excitation light. Wavelength conversion device 100 is disposed on an optical path along which the excitation light emitted from excitation light source 40 runs. Phosphor part 20 of wavelength conversion device 100 is positioned between excitation light source 40 and substrate 10 of wavelength conversion device 100. Optical device 200 is a reflective optical device. Also usable instead of wavelength conversion device 100 is wavelength conversion device 110 described with reference to FIG. 4, wavelength conversion device 120 described with reference to FIG. 5, wavelength conversion device 130 described with reference to FIG. 6, or wavelength conversion device 140 described with reference to FIG. 7. A combination of wavelength conversion devices 100, 110, 120, 130, 140 is also usable in optical device 200.

Excitation light source 40 is typically a semiconductor light-emitting device. The semiconductor light-emitting device may be a light-emitting diode (LED), a superluminescent diode (SLD), or a laser diode (LD).

Excitation light source 40 may be a single LD or may be composed of plural LDs. The LDs may be optically coupled. Excitation light source 40 is configured to emit, for example, blue light. In the present disclosure, the blue light has a peak wavelength ranging from 420 nm to 470 nm.

Optical device 200 may further include optical system 50. Optical system 50 may be positioned on the optical path of the excitation light emitted from excitation light source 40. Optical system 50 includes optical components such as a lens, a mirror, and an optical fiber.

Modification of Optical Device

Figure 9:
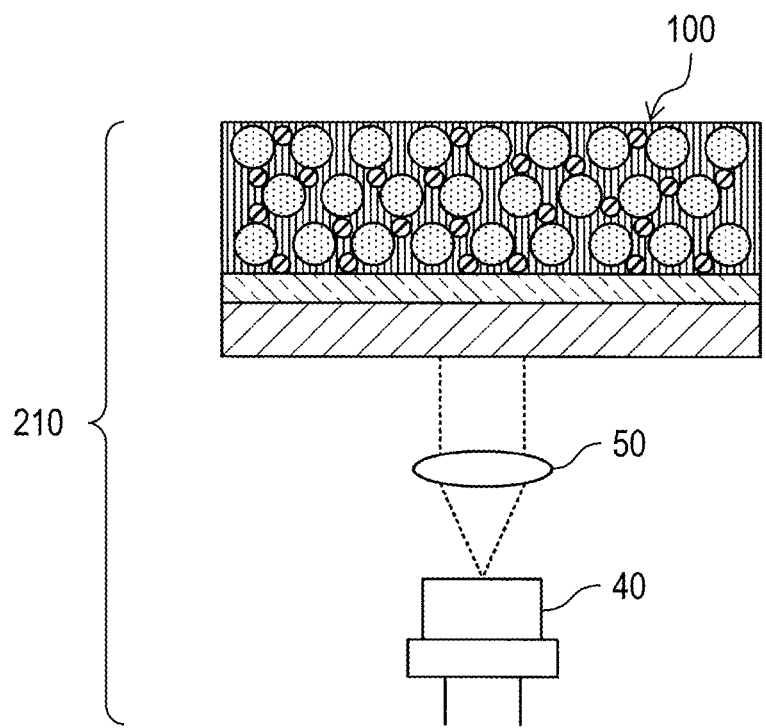
FIG. 9 is a schematic sectional view of a transmissive optical device including the wavelength conversion device according to the present disclosure.

Phosphor part 20 is not necessarily disposed between excitation light source 40 and substrate 10 of wavelength conversion device 100. FIG. 9 is a schematic sectional view of optical device 210 according to a modification. In FIG. 9, excitation light source 40 of optical device 210 faces substrate 10 of wavelength conversion device 100. In optical device 210, substrate 10 transmits excitation light. The excitation light passes through substrate 10 and reaches phosphor part 20. Optical device 210 is a transmissive optical device.

Other Modifications of Optical Device

Figure 10:
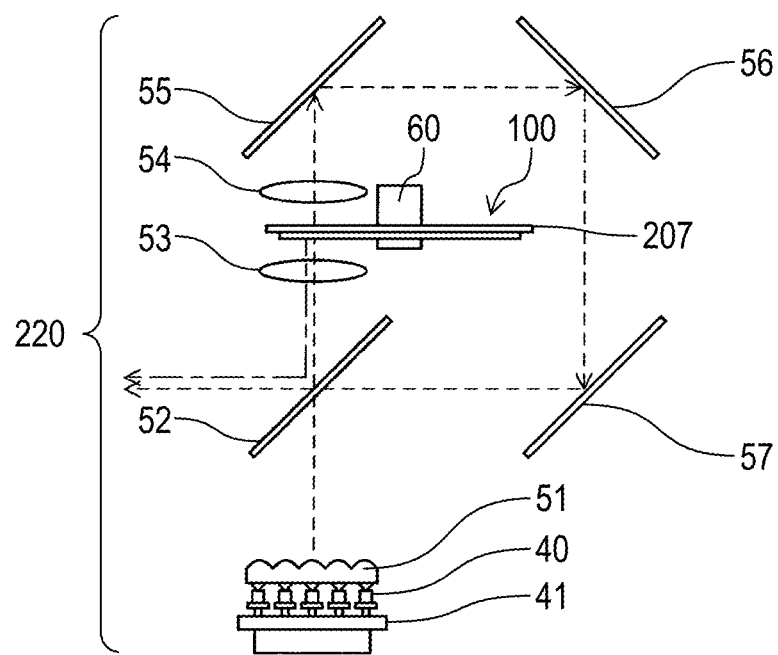
FIG. 10 schematically illustrates an optical device according to a modification of the present disclosure.

FIG. 10 is a schematic sectional view of optical device 220 according to another modification. As shown in FIG. 10, optical device 220 according to the modification includes plural excitation light sources 40 and wavelength conversion device 100. In FIG. 10, phosphor part 20 of wavelength conversion device 100 is positioned between substrate 10 of wavelength conversion device 100 and each of excitation light sources 40. Excitation light sources 40 face phosphor part 20 of wavelength conversion device 100. Optical device 220 is suitable for use in a projector.

Figure 11:
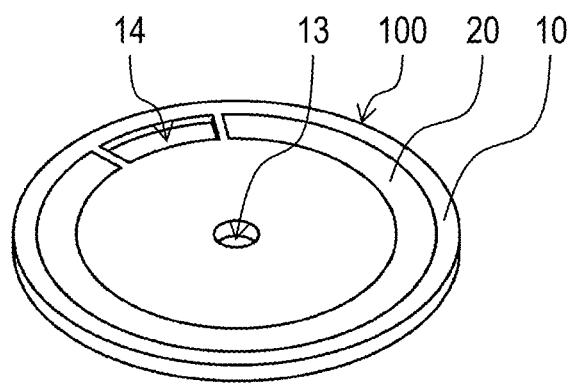
FIG. 11 is a perspective view of the wavelength conversion device of the optical device illustrated in FIG. 10.

FIG. 11 is a perspective view of wavelength conversion device 100 included in optical device 220. As shown in FIG. 11, wavelength conversion device 100 of optical device 220 has a wheel shape. Specifically, substrate 10 of wavelength conversion device 100 of optical device 220 has a disk shape. Substrate 10 has through hole 13 therein and includes light-transmitting part 14. Through hole 13 extends along a thickness of substrate 10. Through hole 13 is positioned, for example, at a center of a virtual circle defined by an outer peripheral surface of substrate 10. Light-transmitting part 14 transmits light and has an arcuate shape, that is, an annular fan shape. Light-transmitting part 14 may contact phosphor part 20. Light-transmitting part 14 is, for example, a through-hole. Light-transmitting part 14 may be made of transparent resin or glass. Light-transmitting part 14 may be made of material, such as sapphire or quartz, having a light transmitting property.

Phosphor part 20 has an arcuate shape, that is, an annular fan shape. Phosphor part 20 and light-transmitting part 14 are arranged along a virtual circle defined by an outer circumferential surface of phosphor part 20. A main surface of substrate 10 is partly covered with phosphor part 20. Wavelength conversion device 100 of optical device 220 may include plural phosphor parts 20. Phosphor parts 20 may be arranged along a virtual circle defined by an outer circumferential surface of specified phosphor part 20. Phosphor parts 20 may include phosphors 22 with different compositions.

As illustrated in FIG. 10, optical device 220 may further include motor 60. Wavelength conversion device 100 is disposed on motor 60. Specifically, a shaft of motor 60 is inserted into through hole 13 of substrate 10. Wavelength conversion device 100 is fixed to motor 60 with a fixing device, such as a screw. While being rotated by motor 60, wavelength conversion device 100 is irradiated with excitation light emitted from excitation light sources 40. Phosphor part 20 are be prevented from being locally irradiated with the excitation light. This configuration prevents the temperature of phosphor part 20 from raising due to the excitation light and fluorescence light.

Optical device 220 may further include collimator lens 51, dichroic mirror 52, lenses 53 and 54, and reflecting mirrors 55, 56, and 57. Collimator lens 51, dichroic mirror 52. Lens 53 is positioned between wavelength conversion device 100 and each of excitation light sources 40. Collimator lens 51, dichroic mirror 52, and lens 53 are arranged in this order on an optical path along which the excitation light emitted from excitation light sources 40 travels. Lens 54, reflecting mirrors 55, 56, and 57, and dichroic mirror 52 are arranged in this order on an optical path along which the excitation light transmitted by wavelength conversion device 100 travels.

Collimator lens 51 focuses the excitation light emitted by plural excitation light sources 40 to provide collimated light. Dichroic mirror 52 transmits the excitation light and efficiently reflecting the light emitted from wavelength conversion device 100. Lens 53 focuses the excitation light and the light emitted from wavelength conversion device 100. Lens 54 focuses the excitation light transmitted by wavelength conversion device 100, providing collimated light. Reflecting mirrors 55, 56, and 57 reflect the excitation light.

Optical device 220 may further include heat sink 41. Heat sink 41 contacts excitation light sources 40. Heat sink 41 readily transmits heat from excitation light sources 40. This configuration reduced or prevents increase of temperature of excitation light sources 40, accordingly reducing or preventing decrease in energy conversion efficiency of excitation light sources 40.

An operation of optical device 220 will be described below.

Excitation light sources 40 emit the excitation light. The excitation light is focused by collimator lens 51 and is converted into collimated light. Then, the excitation light is transmitted by dichroic mirror 52 and is focused further by lens 53. Lens 53 adjusts a spot diameter of the excitation light incident on phosphor part 20. Next, the excitation light enters into wavelength conversion device 100. Wavelength conversion device 100 rotated by motor 60. Therefore, the operation of optical device 220 includes a period during which the excitation light is incident on phosphor part 20 and a period during which the excitation light is transmitted by light-transmitting part 14. While the excitation light is incident on phosphor part 20, wavelength conversion device 100 emits light with the longer wavelength than the excitation light. In the period during which the excitation light is transmitted by light-transmitting part 14, the excitation light enters into lens 54. The light emitted from wavelength conversion device 100 is focused by lens 53 and is converted into collimated light. The light emitted from wavelength conversion device 100 reflects on dichroic mirror 52 and is transmitted outside optical device 220.

The excitation light transmitted by light-transmitting part 14 is focused by lens 54 and is converted into the collimated light. The excitation light that has passed through lens 54 reflects on reflecting mirrors 55, 56, and 57. Then, the excitation light is transmitted by dichroic mirror 52. The excitation light is thus output from optical device 220. At this moment, the excitation light is mixed with the light emitted from wavelength conversion device 100.

Projector According to Exemplary Embodiment

Figure 12:
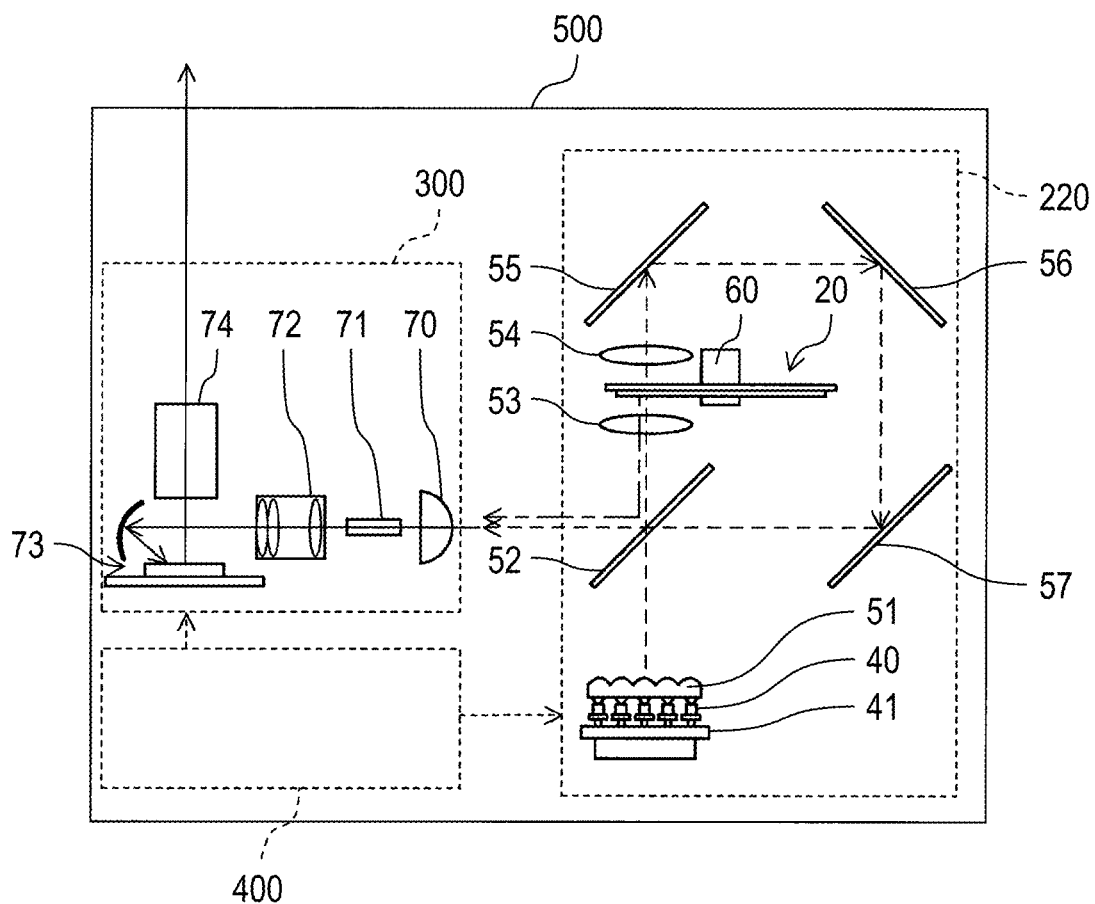
FIG. 12 schematically illustrates a projector including the optical device according to the present disclosure.

FIG. 12 is a schematic diagram of projector 500 according to the embodiment. As illustrated in FIG. 12, projector 500 includes optical device 220, optical unit 300, and controller 400. Optical unit 300 converts light emitted from optical device 220 and projects an image or video onto an object outside projector 500. The object may be a screen. Optical unit 300 includes converging lens 70, rod integrator 71, lens unit 72, display device 73, and projector lens 74.

Converging lens 70 converges the light emitted from optical device 220. The light emitted from optical device 220 thus converges to an incidence end surface of rod integrator 71.

Rod integrator 71 has, for example, a quadrangular prism shape. The light incident on the incidence end surface of rod integrator 71 repeats total reflections inside rod integrator 71 and is emitted from an emission end surface of rod integrator 71. The light exited from rod integrator 71 has a uniform luminance distribution.

Lens unit 72 includes plural lenses. The lenses of lens unit 72 A may include a condenser lens and a relay lens. Lens unit 72 guides the light exited from rod integrator 71 to display device 73.

Display device 73 converts the light that has passed through lens unit 72. Consequently, the image or the video is obtained for projection onto the object outside projector 500. Display device 73 is, for example, a digital mirror device (DMD).

Projector lens 74 projects the light converted by display device 73 to outside projector 500. The light converted by display device 73 is thus projected onto the object. Projector lens 74 includes one or more lenses. The lenses included in projector lens 74 may include a biconvex lens and a plano-concave lens.

Controller 400 is configured to control optical device 220 and optical unit 300. Controller 400 is implemented by, for example, a microcomputer or a processor.

Figure 13:
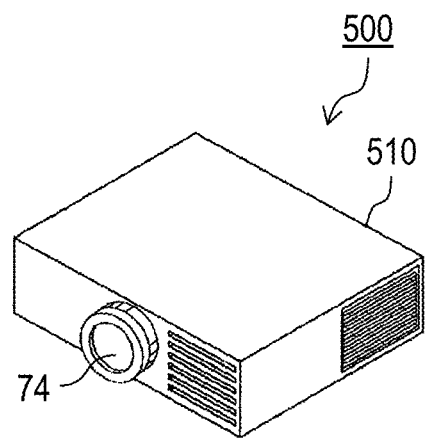
FIG. 13 is a perspective view of the projector illustrated in FIG. 12.

FIG. 13 is a perspective view of projector 500. As illustrated in FIG. 13, projector 500 further includes housing 510. Housing 510 accommodates therein optical device 220, optical unit 300, and controller 400. A part of projector lens 74 of optical unit 300 is exposed from the hosing as an external part of housing 510.

Lighting Device According to Exemplary Embodiment

Figure 14:
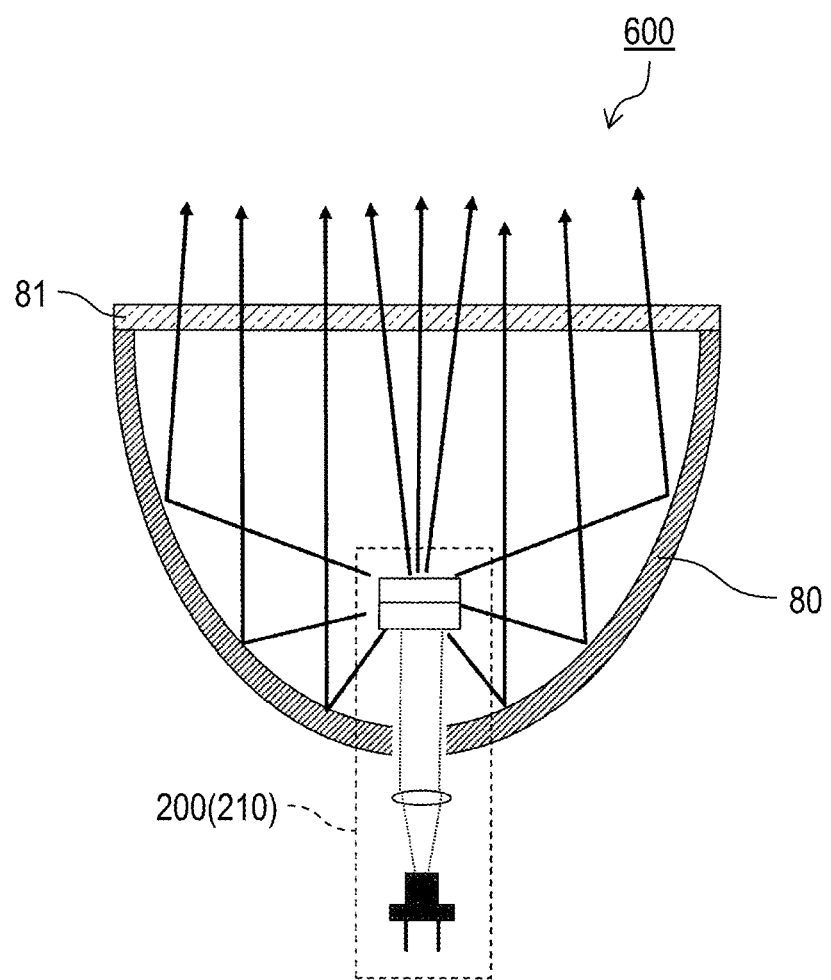
FIG. 14 schematically illustrates a lighting device including the optical device according to the present disclosure.

FIG. 14 is a schematic diagram of lighting device 600 according to the embodiment. As illustrated in FIG. 14, lighting device 600 includes optical device 200 and optical component 80. Optical device 210 described with reference to FIG. 9 is also a usable alternative to optical device 200. Optical component 80 is configured to guide forwards light emitted from optical device 200, and is specifically a reflector. Optical component 80 includes, for example, a film made of metal, such as Al or Ag, or an Al film having surfaces having a dielectric layer provided thereon. Filter 81 may be provided in front of optical device 200. Filter 81 absorbs or scatters coherent blue light from the excitation light source of optical device 200 to prevent the blue light from being output directly. Lighting device 600 may be a so-called reflector or a projector. Lighting device 600 is, for example, a vehicle headlamp.

EXAMPLES

The present disclosure will be described on the basis of examples. The following examples are not in any way restrictive of the present disclosure.

Filler Particles

Samples 1 to 5

Samples 1 to 5 of the filler particles were prepared. Sample 1 of the filler particles was made of alumina. Sample 2 of the filler particles was made of polystyrene. Sample 3 of the filler particles was made of polymethyl methacrylate (PMMA). Sample 4 of the filler particles was silicone composite particles each including a core made of silicone rubber and a shell made of silicone resin other than the silicone rubber. Sample 5 of the filler particles was made of silicone rubber.

Adhesiveness of Filler Particles

An adhesion test was conducted for filler particles of samples 1 to 5. In the adhesion test for each sample, filler particles were placed in a petri dish, and the petri dish was heated with a dryer. The filler particles were heated at an ambient temperature of 200° C. for 24 hours. Table 1 shows results of the adhesion test. When the filler particles adhering to one other and became a lump after the heating, their adhesiveness was rated "good" (denoted by "G"). When the filler particles did not adhere to one another, their adhesiveness was rated "poor" (denoted by "NG"). The filler particle were heated also at an ambient temperature of 240° C. for 24 hours.

TABLE 1

| Sample | Material | Adhesiveness 200° C. | Adhesiveness 240° C. |
|---|---|---|---|
| 1 | Alumina | NG | NG |
| 2 | Polystyrene | G | — |
| 3 | PMMA | G | G |
| 4 | Silicone Rubber Silicone Resin | G | G |
| 5 | Silicone Rubber | G | G |

As shown in Table 1, Samples 2 to 5 of the filler particles including the resin material had adhesiveness.

Light Absorptivity of Filler Particles

An absorptivity of filler particles from each of samples 1 to 5 was measured both for light with a wavelength of 450 nm and light with a wavelength of 550 nm. An absolute PL quantum yield measurement device (C9920-02G manufactured by Hamamatsu Photonics K.K.) was used to measure the absorptivity. In the absorptivity measurement, a petri dish made of synthetic quartz was used. The bottom of the petri dish had a circular shape in plan view. In plan view, the bottom of the petri dish had a diameter of about 17 mm. The petri dish had a thickness of about 5 mm. The petri dish included a lid. Table 2 shows measurement results.

When the filler particles had the absorptivity less than or equal to 10% for the light with the wavelength of 550 nm, their heat resistance was rated "good" (denoted by "G") in Table 2. When the filler particles had the absorptivity of greater than 10% and less than or equal to 25% for the light with the wavelength of 550 nm, their heat resistance was rated "moderately good" (denoted by "F"). When the filler particles had the absorptivity of greater than 25% for the light with the wavelength of 550 nm, their heat resistance was rated "poor" (denoted by "NG").

Heat Resistance of Filler Particles at 200° C.

Samples 1 to 5 of filler particles were heated at an ambient temperature of 200° C. for 24 hours. An absorptivity of the heated filler particles was measured both for light with a wavelength of 450 nm and for light with a wavelength of 550 nm in the same way as described above. Table 2 shows supposition results.

When the filler particles had the absorptivity of less than or equal to 10% for the light with the wavelength of 550 nm, their heat resistance at 200° C. was rated "good" (denoted by "G") in Table 2. When the filler particles had the absorptivity of greater than 10% and less than or equal to 25% for the light with the wavelength of 550 nm, their heat resistance at 200° C. was rated "moderately good" (denoted by "F").

When the filler particles had the absorptivity of greater than 25% for the light with the wavelength of 550 nm, their heat resistance at 200° C. was rated "poor" (denoted by "NG").

Heat Resistance of Filler Particles at 240° C.

Samples 1 to 5 of the filler particles were heated at an ambient temperature of 240° C. for 24 hours. An absorptivity of the heated filler particles was measured both for light with a wavelength of 450 nm and for light with a wavelength of 550 nm in the same way as described above. Table 2 shows measurement results.

When the filler particles had the absorptivity of less than or equal to 10% for the light with the wavelength of 550 nm, their heat resistance at 240° C. was rated "good" (denoted by "G") in Table 2. When the filler particles had the absorptivity of greater than 10% and less than or equal to 25% for the light with the wavelength of 550 nm, their heat resistance at 240° C. was rated "moderately good" (denoted by "F"). When the filler particles had the absorptivity of greater than 25% for the light with the wavelength of 550 nm, their heat resistance at 240° C. was rated "poor" (denoted by "NG").

TABLE 2

| Sample | Material | Initial Absorptivity (%) | | Evaluation of Heat Resistance |
|---|---|---|---|---|
| | | 450 nm | 550 nm | |
| 1 | Alumina | 0 | 0 | G |
| 2 | Polystyrene | 6.3 | 0.6 | G |
| 3 | PMMA | 3.5 | 0.7 | G |
| 4 | Silicone Rubber Silicone Resin | 0.2 | 0 | G |
| 5 | Silicone Rubber | 0 | 0 | G |

| Sample | Material | Absorptivity (%) after Heating at 200° C. | | Evaluation of Heat Resistance at 200° C. |
|---|---|---|---|---|
| | | 450 nm | 550 nm | |
| 1 | Alumina | 0 | 0 | G |
| 2 | Polystyrene | 55.9 | 29.8 | NG |
| 3 | PMMA | 24.0 | 10.3 | F |
| 4 | Silicone Rubber Silicone Resin | 1.4 | 0.2 | G |
| 5 | Silicone Rubber | — | — | — |

| Sample | Material | Absorptivity (%) after Heating at 240° C. | | Evaluation of Heat Resistance at 240° C. |
|---|---|---|---|---|
| | | 450 nm | 550 nm | |
| 1 | Alumina | 0 | 0 | G |
| 2 | Polystyrene | — | — | — |
| 3 | PMMA | 68.8 | 34.5 | NG |
| 4 | Silicone Rubber Silicone Resin | 1.8 | 1.0 | G |
| 5 | Silicone Rubber | 0 | 0 | G |

As shown in Table 2, Samples 4 and 5 of the filler particles included the silicone rubber or the silicone resin had excellent heat resistance in addition to the excellent adhesiveness.

Precursors of Phosphor Part

Comparative Example 1

A precursor of a phosphor part according to Comparative Example 1 was made by the following method. A crystalline ZnO film was formed on a substrate body first. The substrate body was a silicon substrate with a reflective layer. The substrate body had a square shape in plan view. In plan view, the length of one side of the substrate body was 5 mm. A phosphor in the form of particles was deposited on the ZnO film. Next, the phosphor particles were heated at an ambient temperature of 200° C. for 10 minutes and then at an ambient temperature of 250° C. for 30 minutes. The precursor of the phosphor part according to Comparative Example 1 was thus formed on the substrate. The phosphor was made of $Y_3Al_5O_{12}$:Ce (YAG). The phosphor particles had an average particle diameter of 16 μm. The precursor had a thickness of 80 μm. The precursor had a circular shape in plan view. In plan view, the precursor had a diameter of 3 mm.

Comparative Example 2

A precursor of a phosphor part according to Comparative Example 2 was obtained by the same method as in Comparative Example 1, except that filler particles from sample 1 were deposited on the ZnO film together with the phosphor particles. In the precursor of the phosphor part according to Comparative Example 2, a value of V2/(V1+V2) was 0.05 where V1 is the total volume of the phosphor particles (the volume of the phosphor as a whole) and V2 is the total volume of the filler particles.

Example 1

A precursor of a phosphor part according to Example 1 was obtained by the same method as in Comparative Example 2, except that the filler particles from sample 1 were replaced by filler particles from sample 2.

Example 2

A precursor of a phosphor part according to Example 2 was obtained by the same method as in Comparative Example 2, except that Sample 1 of the filler particles were replaced by Sample 3 of the filler particles.

Example 3

A precursor of a phosphor part according to Example 3 was obtained by the same method as in Comparative Example 2, except that Sample 1 of the filler particles were replaced by Sample 4 of the filler particles with the value of V2/(V1+V2) adjusted to 0.16.

Example 4

A precursor of a phosphor part according to Example 4 was obtained by the same method as in Comparative Example 2, except that Sample 1 of the filler particles were replaced by Sample 5 of filler particles.

Example 5

A precursor of a phosphor part according to Example 5 was obtained by the same method as in Example 4, except that the value of V2/(V1+V2) was adjusted to 0.16.

Vibration Test of Precursors of Phosphor Parts

The precursors of the phosphor parts according to Comparative Examples 1 and 2 and Examples 1 to 5 were subjected to a vibration test. The precursor of the phosphor part together with the substrate was placed in a chip case (CT100-066 manufactured by Dainichi Shoji K.K.) first. The chip case had a pocket having a square shape in plan view. In plan view, the length of one side of the pocket was 6.6 mm. The pocket had a depth of 2.54 mm. Next, the chip case was placed on a vibration testing machine. The chip case was vibrates by the vibration testing machine. The amplitude of the vibration of the chip case was 4.5 mm. The vibration testing machine converts rotation of a motor into vibration. Vibration intensities were defined as follows. A vibration produced when the motor rotated at a speed of 200 rpm had an intensity of 1, and a vibration produced when the motor rotated at a speed of 2500 rpm had an intensity of 10. The vibration test started at the intensity of 1. The intensity was then increased by 1 after every lapse of 20 seconds. The vibration test terminated 20 seconds after the vibration intensity reached 10. Table 3 shows results of the vibration test.

Those numerical values under "Vibration Test" in Table 3 each denote the vibration intensity at which the phosphor particles fell from the precursor of the phosphor part. However, the phosphor particles did not fall from the precursor of the phosphor part according to Example 5 even when vibrated at the intensity of 10 indicated in Table 3.

Figure 15A:
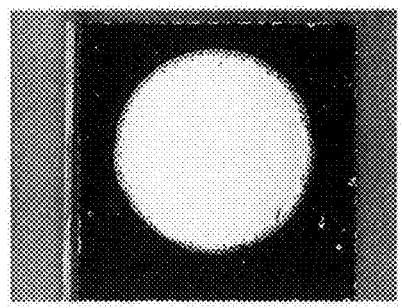
FIG. 15A is a microscopic image of a precursor of a phosphor part according to Example 2 before a vibration test.
Figure 15B:
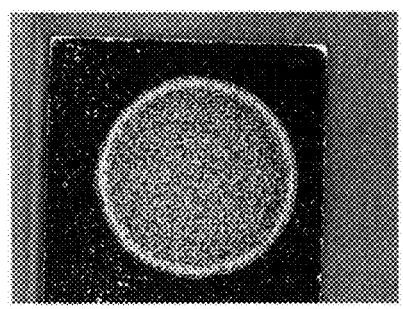
FIG. 15B is a microscopic image of the precursor of the phosphor part of Example 2 after the vibration test.
Figure 16A:
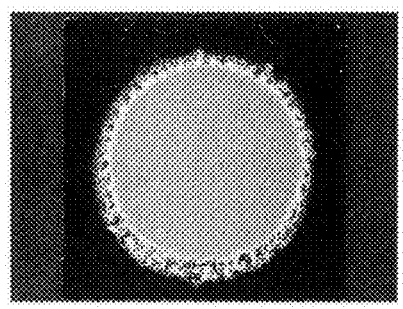
FIG. 16A is a microscopic image of a precursor of a phosphor part of Example 3 before the vibration test.
Figure 16B:
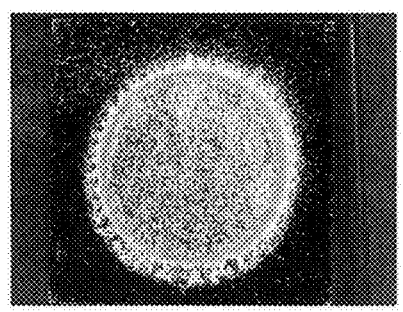
FIG. 16B is a microscopic image of the precursor of the phosphor part according to Example 3 after the vibration test.

Before and after the vibration test, surfaces of the precursors of the phosphor parts were observed with a microscope at a magnification of 50×. The microscope was a digital microscope VH-5000 manufactured by KEYENCE Corporation. FIG. 15A is a microscopic image of the precursor of the phosphor part according to Example 2 before the vibration test. FIG. 15B is a microscopic image of the precursor of the phosphor part according to Example 2 after the vibration test. As shown in FIGS. 15A and 15B, the large vibration caused the phosphor to fall off from the precursor of the phosphor part. FIG. 16A is a microscopic image of the precursor of the phosphor part according to Example 3 before the vibration test. FIG. 16B is a microscopic image of the precursor of the phosphor part according to Example 3 after the vibration test. As shown in FIGS. 16A and 16B, the large vibration caused the phosphor to fall from the precursor of the phosphor part.

Immersion Test on Precursors of Phosphor Part

Precursors of phosphor parts according to Comparative Examples 1 and 2 and Examples 1 to 5 were subjected to an immersion test. Ten pieces of each of Comparative Examples 1 and 2 and Examples 1 to 5 of the precursors of the phosphor parts were first prepared. Each precursor was supported by a substrate. Next, the substrates supporting the precursors of the phosphor parts were fixed with a jig. The substrates were placed in a test vessel. A solution for ZnO crystal growth was introduced into the vessel. The solution for the crystal growth was an aqueous solution of zinc nitrate and hexamethylenetetramine. The substrates were taken out of the solution.

After the immersion test, the number of substrates having the precursors of the phosphor parts fallen off was counted. Table 3 shows results of the immersion test. When the number of substrates that had their precursors of the phosphor parts fallen off as a result of the immersion test ranged from 0 to 3, inclusive, the result of the immersion test was rated "good" (denoted by "G"). When this figure ranged from 4 to 10, inclusive, the result of the immersion test was rated "poor" (denoted by "NG").

TABLE 3

| | Filler Particle | Material of Filler Particle | Vibration Test | Immersion Test |
|---|---|---|---|---|
| Comparative Example 1 | None | — | 3 | NG |
| Comparative Example 2 | Sample 1 Alumina | | 4 | NG |
| Example 1 | Sample 2 5 vol % | Polystyrene | 7 | G |
| Example 2 | Sample 3 5 vol % | PMMA | 6 | G |
| Example 3 | Sample 4 16 vol % | Silicone Rubber Silicone Resin | 5 | G |
| Example 4 | Sample 5 5 vol % | Silicone Rubber | 6 | G |
| Example 5 | Sample 5 16 vol % | Silicone Rubber | 10 | G |

As shown in Table 3, Examples 1 to 5 of the precursor of the phosphor part including the filler particles containing resin material had sufficiently reduced the falling of the phosphor from the substrate compared with Comparative Examples 1 and 2 of the precursor of the phosphor part.

Wavelength Conversion Devices

Next, wavelength conversion devices including Examples 2, 3, and 5 of the precursors of phosphor parts were made. A crystalline ZnO matrix was formed on a ZnO film by a solution growth method. A solution used for crystal growth was an aqueous solution of zinc nitrate and hexamethylenetetramine. The wavelength conversion devices based on each of Examples 2, 3, and 5 were obtained.

Figure 17A:
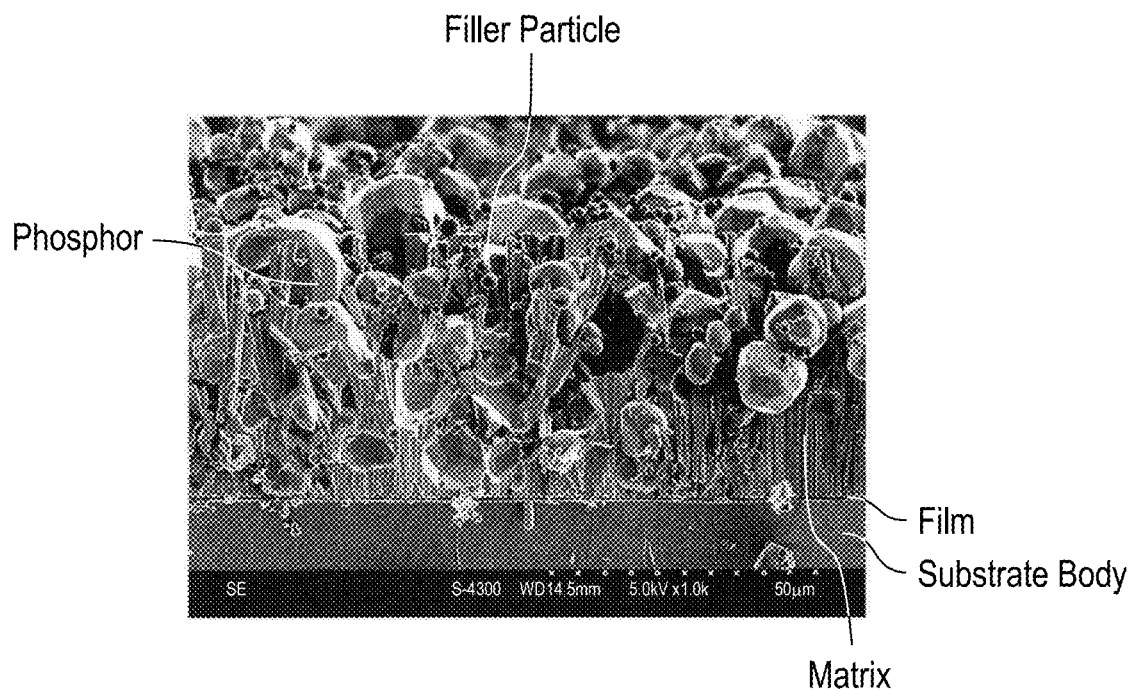
FIG. 17A is a scanning electron microscope (SEM) image of a section of a wavelength conversion device based on Example 2.
Figure 17B:
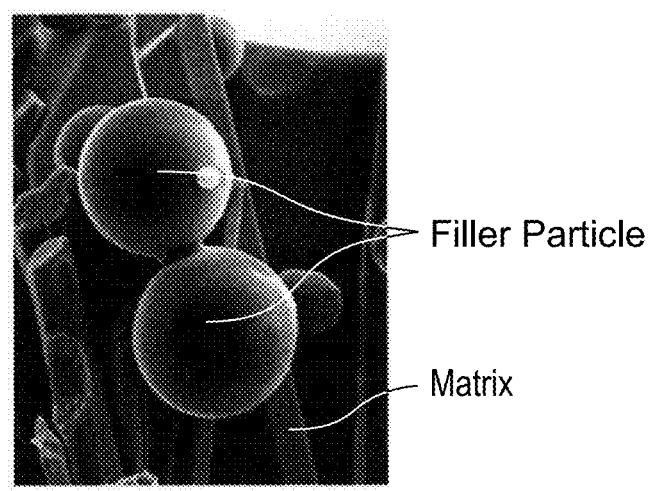
FIG. 17B is an enlarged image of filler particles shown in FIG. 17A.

Next, the wavelength conversion device based on Example 2 was cut, and a section thereof was observed with a scanning electron microscope (SEM). The SEM was S-4300 manufactured by Hitachi High-Tech Corporation. FIG. 17A is an SEM image of the section of the wavelength conversion device based on Example 2. FIG. 17B is an enlarged image of filler particles shown in FIG. 17A. As shown in FIG. 17A, the filler particles of the wavelength conversion device adhered to the phosphor. As shown in FIG. 17B, some of the filler particles included in the wavelength conversion device adhered to each other. The filler particles adhering to each other retained their particle shapes.

Figure 18A:
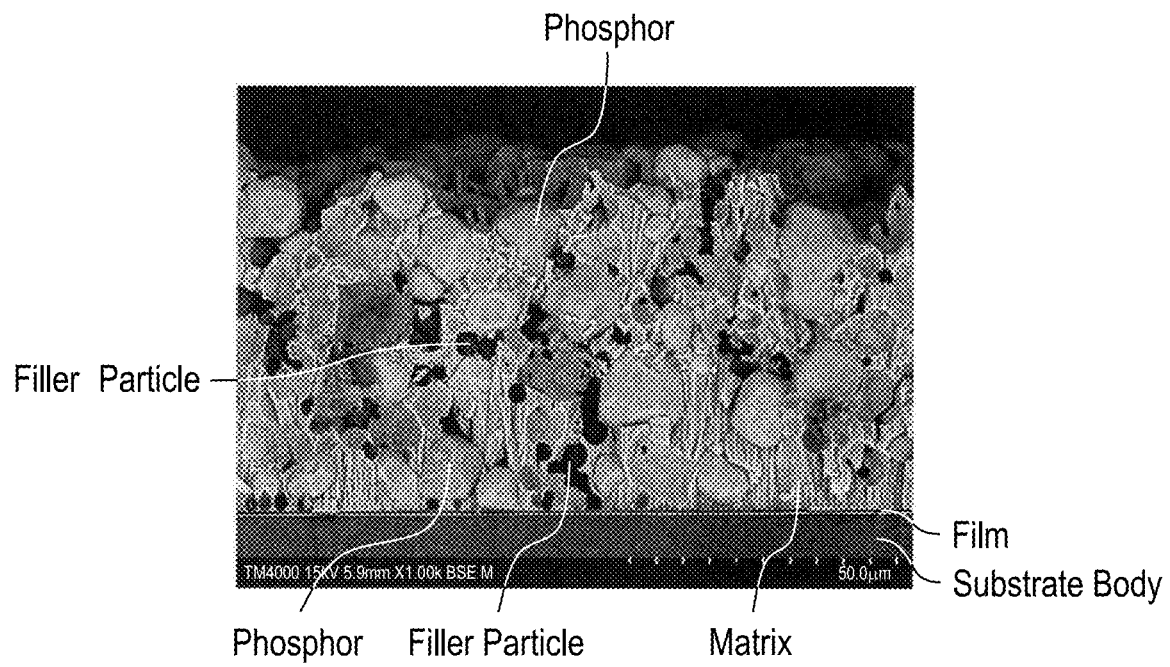
FIG. 18A is an SEM image of a section of a wavelength conversion device based on Example 3.
Figure 18B:
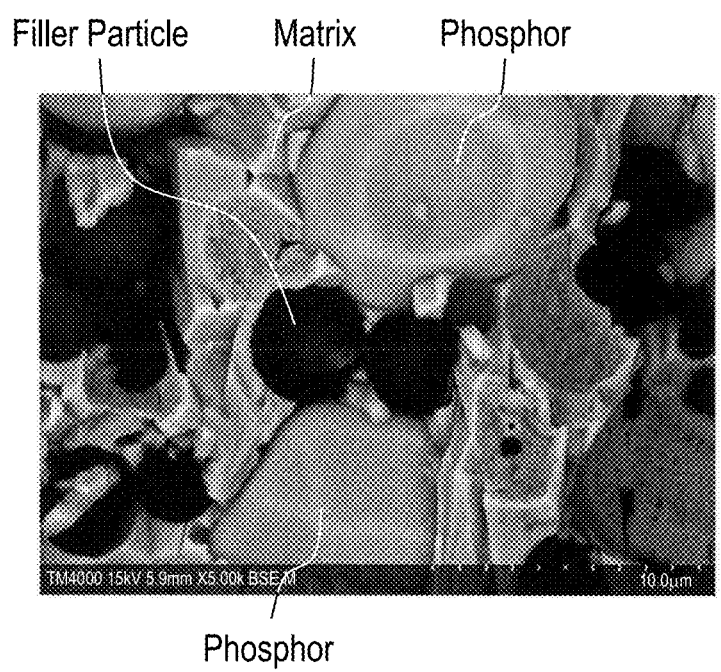
FIG. 18B is an enlarged image of filler particles of the wavelength conversion device shown in FIG. 18A.
Figure 18C:
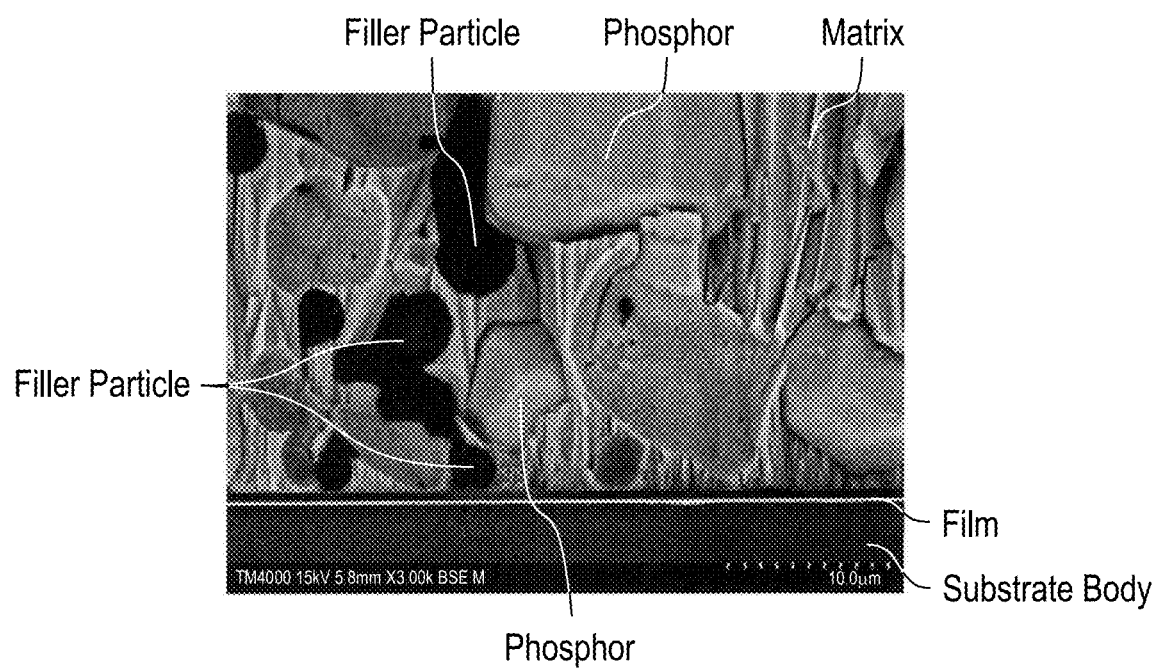
FIG. 18C is an enlarged image of other filler particles of the wavelength conversion device shown in FIG. 18A.

Similarly to the wavelength conversion device based on Example 2, the wavelength conversion device based on Example 3 was cut, and a section thereof was observed with an SEM. The SEM used was a tabletop microscope Miniscope TM4000Plus manufactured by Hitachi High-Tech Corporation. FIG. 18A is an SEM image of the section of the wavelength conversion device based on Example 3. FIG. 18B is an enlarged image of filler particles shown in FIG. 18A. FIG. 18C is an enlarged image of other filler particles shown in FIG. 18A. As shown in FIG. 18A, the filler particles of the wavelength conversion device adhered to the phosphor. As shown in FIG. 18B, some of the filler particles of the wavelength conversion device adhered to two phosphor particles. As shown in FIG. 18C, some of the filler particles of the wavelength conversion device adhered to the phosphor particles and the substrate.

Light Emission Efficiency of Wavelength Conversion Devices

Light emission efficiency measurement was performed on Examples 2, 3, and 5 of the wavelength conversion devices. The light emission efficiency measurement was performed with a multichannel spectroscope (MCPD-9800 manufactured by Otsuka Electronics Co., Ltd.) and an integrating sphere manufactured by Labsphere, Inc. Excitation light of an LD used had a wavelength of 445 nm. The excitation light had an energy density of 2 W/mm². Table 4 shows measurement results.

Next, Examples 2, 3, and 5 of the wavelength conversion devices were heated at an ambient temperature of 240° C. for 24 hours. The light emission efficiency measurement was performed by the above method on the heated wavelength conversion devices. Table 4 shows measurement results.

TABLE 4

|  | Filler Particle | Material of Filler Particle | Light Emission Efficiency (%) | |
|---|---|---|---|---|
|  |  |  | Initial | After Heating |
| Example 2 | Sample 3 5 vol % | PMMA | 92 | 85 |
| Example 3 | Sample 4 16 vol % | Silicone Rubber Silicone Resin | 93 | 93 |
| Example 5 | Sample 5 16 vol % | Silicone Rubber | 92 | 92 |

As shown in Table 4, the wavelength conversion devices based on Examples 2, 3, and 5 all had satisfactory light emission efficiency. The wavelength conversion devices based on Examples 3 and, 5 in particular had satisfactory light emission efficiencies sustained even after the heating.

Wavelength conversion device 100 (110, 120, 130, 140) according to the present disclosure includes matrix 21 containing the inorganic material, phosphor 22 embedded in matrix 21, and filler particles 23 embedded in matrix 21 and containing the resin material.

Since filler particles 23 contain the resin material, filler particles 23 adhere to phosphor 22. Filler particles 23 also adhere to substrate 10 that is used when the wavelength conversion device is manufactured. Therefore, filler particles 23 can fix phosphor 22 onto substrate 10. This configuration prevents phosphor 22 from falling off from substrate 10 before matrix 21 is formed. This means that the wavelength conversion device has reduced or no falls of phosphor 22.

The wavelength conversion device may further include substrate 10 supporting matrix 21. Filler particles 23 may be between phosphor 22 and substrate 10. This configuration provides the wavelength conversion device preventing phosphor 22 from falling off.

Substrate 10 of the wavelength conversion device may be made of at least one selected from the group consisting of stainless steel, the composite material containing aluminum and silicon carbide, the composite material containing aluminum and silicon, the composite material containing aluminum and carbon, and copper. Substrate 10 has a small thermal expansion coefficient. Therefore, the wavelength conversion device has high reliability even when substrate 10 has a high temperature when the wavelength conversion device is in use.

Matrix 21 of the wavelength conversion device containing the inorganic crystal exhibits excellent heat dissipation.

The above-mentioned inorganic crystal of the wavelength conversion device may include zinc oxide. Consequently, matrix 21 exhibits higher heat dissipation.

The zinc oxide mentioned above may be c-axis oriented in the wavelength conversion device. Consequently, matrix 21 exhibits even better heat dissipation.

The above-mentioned resin material in the wavelength conversion device may include the thermoplastic resin. Consequently, the wavelength conversion device prevents phosphor 22 from falling off.

The above-mentioned resin material may include the thermosetting resin in the wavelength conversion device. Consequently, the wavelength conversion device prevents phosphor 22 from falling off.

Filler particles 23 of the wavelength conversion device may have rubber elasticity. This configuration increases the area of contact between filler particle 23 and phosphor 22. Therefore, filler particles 23 are fixed securely to phosphor 22. Consequently, the wavelength conversion device prevents phosphor 22 from falling off.

The above-mentioned resin material in the wavelength conversion device may include the polymer compound including the siloxane bonds. Consequently, filler particles 23 have excellent heat resistance.

Each filler particle 23 of the wavelength conversion device may include core 30 and shell 31 covering core 30. Consequently, filler particles 23 have the excellent dispersibility.

Each filler particle 23 of the wavelength conversion device may have the surface modified with the functional group. Consequently, filler particles 23 have the excellent dispersibility.

The absorptivity of filler particles 23 of the wavelength conversion device to the light with the wavelength of 550 nm is preferably less than or equal to 25%. Consequently, the wavelength conversion device has a high light emission efficiency.

The value of $V2/(V1+V2)$ of the wavelength conversion device provided by the volume V1 of phosphor 22 and the total volume V2 of filler particles 23 may range from 0.05 to 0.16. This configuration provides the wavelength conversion device preventing phosphor 22 from falling off.

Optical device 200 (210, 220) includes wavelength conversion device 100 (110, 120, 130, 140) and excitation light source 40 that irradiates the wavelength conversion device with excitation light. The wavelength conversion device of the optical device prevents phosphor 22 from falling off.

Projector 500 includes the above wavelength conversion device. The wavelength conversion device of projector 500 prevents phosphor 22 from falling off.

Phosphor 22 and filler particles 23 containing the resin material are deposited on substrate 10. Phosphor 22 is fixed to substrate 10 with filler particles 23. Matrix 21 including the inorganic material is formed such that filler particles 23 and phosphor 22 are embedded in matrix 21, thus providing the wavelength conversion device.

Phosphor 22 is fixed to substrate 10 with filler particles 23. This configuration prevents phosphor 22 from falling off from substrate 10 before matrix 21 is formed.

In this manufacturing method, phosphor 22 may be fixed to substrate 10 by causing filler particles 23 to adhere to phosphor 22 and substrate 10. This facilitates the fixing of phosphor 22 to substrate 10.

In this manufacturing method, filler particles 23 may be heated to adhere to phosphor 22 and substrate 10. This facilitates the fixing of phosphor 22 to substrate 10.

INDUSTRIAL APPLICABILITY

A wavelength conversion device according to the present disclosure is usable, for example, in light sources including: general lighting devices such as ceiling lights; special lighting devices such as spotlights, stadium lighting, and studio lighting; lighting devices for vehicles, such as headlamps; projection devices such as projectors and head-up displays; endoscope lighting devices for medical or industrial use; imaging devices such as digital cameras, mobile phones, and smartphones; and liquid-crystal display devices such as personal computer (PC) monitors, notebook personal computers, televisions, personal digital assistants (PDXs), the smartphones, tablet PCs, and the mobile phones.

REFERENCE MARKS IN THE DRAWINGS 10 substrate
11 substrate body
12 film
20 phosphor part
21 matrix
22 phosphor
23 filler Particle
30 core
31 shell
40 excitation light source
100, 110, 120, 130, 140 wavelength conversion device
200, 210, 220 optical device
500 projector
600 lighting device

The invention claimed is:

1. A wavelength conversion device comprising:
a matrix containing inorganic material;
a phosphor embedded in the matrix; and
a plurality of filler particles embedded in the matrix, the plurality of filler particles containing resin material,
wherein the filler particles are elastomer.

2. The wavelength conversion device according to claim 1, further comprising
a substrate supporting the matrix, wherein
the plurality of filler particles are disposed between the phosphor and the substrate.

3. The wavelength conversion device according to claim 2, wherein the substrate includes at least one selected from the group consisting of a stainless steel, a composite material including aluminum and silicon carbide, a composite material including aluminum and silicon, a composite material including aluminum and carbon, and copper.

4. The wavelength conversion device according to claim 1, wherein the matrix includes inorganic crystal.

5. The wavelength conversion device according to claim 4, wherein the inorganic crystal includes zinc oxide.

6. The wavelength conversion device according to claim 5, wherein the zinc oxide is c-axis oriented.

7. The wavelength conversion device according to claim 1, wherein the resin material contains includes thermoplastic resin.

8. The wavelength conversion device according to claim 1, wherein the resin material contains thermosetting resin.

9. The wavelength conversion device according to claim 1, wherein the plurality of filler particles include silicone elastomer.

10. The wavelength conversion device according to claim 1, wherein the resin material contains polymer compound including siloxane bond.

11. The wavelength conversion device according to claim 1, wherein each of the plurality of filler particles includes a core and a shell covering the core.

12. The wavelength conversion device according to claim 1, wherein each of the plurality of filler particles has a surface modified with functional group.

13. The wavelength conversion device according to claim 1, wherein the plurality of filler particles have an absorptivity of less than or equal to 25% for light with a wavelength of 550 nm.

14. The wavelength conversion device according to claim 1, wherein a value of V2/(V1+V2) defined by a volume V1 of the phosphor and a total volume V2 of the plurality of filler particles ranges from 0.05 to 0.16.

15. An optical device comprising:
the wavelength conversion device according to claim 1; and
an excitation light source configured to irradiate the wavelength conversion device with excitation light.

16. A projector comprising the wavelength conversion device according to claim 1.

17. A method for manufacturing a wavelength conversion device, comprising:
fixing a phosphor to a substrate with a plurality of filler particles containing silicone elastomer; and
forming a matrix containing inorganic material such that the plurality of filler particles and the phosphor are embedded in the matrix.

18. The method according to claim 17, wherein said fixing of the phosphor to the substrate comprises causing the plurality of filler particles to adhere to the phosphor and the substrate.

19. The method according to claim 18, wherein said causing the plurality of filler particles to adhere to the phosphor and the substrate comprises causing the plurality of filler particles to adhere to the phosphor and the substrate by heating the plurality of filler particles.

20. The wavelength conversion device according to claim 1, wherein
the filler particles are silicone composite particles each including a core made of silicone elastomer and a shell made of silicone resin other than the silicone elastomer.

21. The method according to claim 17, wherein
the filler particles are silicone composite particles each including a core made of silicone elastomer and a shell made of silicone resin other than the silicone elastomer.

* * * * *